United States Patent [19]

Loudermilk et al.

[11] Patent Number: 5,687,233
[45] Date of Patent: Nov. 11, 1997

[54] MODULAR JACK HAVING BUILT-IN CIRCUITRY

[75] Inventors: Gregory Loudermilk, Sacramento, Calif.; Anthony E. Imburgia, Indianapolis, Ind.

[73] Assignee: Maxconn Incorporated, San Jose, Calif.

[21] Appl. No.: 599,610

[22] Filed: Feb. 9, 1996

[51] Int. Cl.[6] .................................................. H04M 1/00
[52] U.S. Cl. ........................ 379/442; 379/442; 379/438; 439/676; 439/620
[58] Field of Search ............................ 439/620, 676; 379/442, 438

[56] References Cited

U.S. PATENT DOCUMENTS 5,069,641 12/1991 Sakamoto et al. ..................... 439/620

*Primary Examiner*—Dwayne Bost
*Assistant Examiner*—Keith Ferguson
*Attorney, Agent, or Firm*—Terry McHugh

[57] ABSTRACT

A modular jack includes a filter circuit for each of the transmit and receive pins in order to shape the signal waveforms, isolate the user from the line, and filter out both common and differential mode noise in high-speed communications systems, such as 10BASE-T, 100BASE-T, token ring and ATM applications. The manufacture of the modular jack of the present invention is simplified by the design of the components which make up the modular jack assembly. More specifically, the contact pins of the modular jack are divided into a contact pin array and a mounting pin array. The two pin arrays are electrically coupled through a printed circuit board which carries the two filters. A platform formed on the mounting pin array facilitates the attachment of the printed circuit board during manufacture.

11 Claims, 3 Drawing Sheets

TOP

BOTTOM

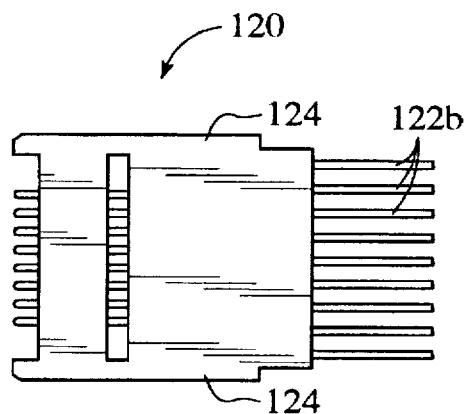
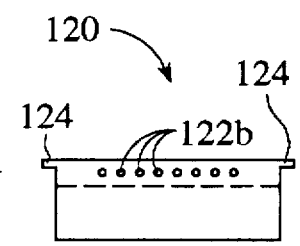
FIG. 7  FIG. 8  FIG. 9
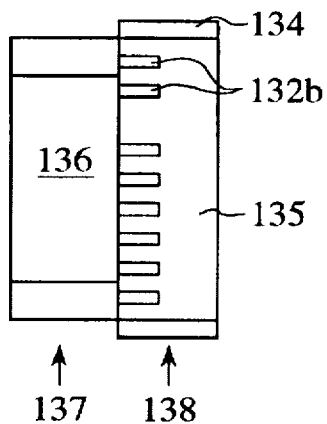
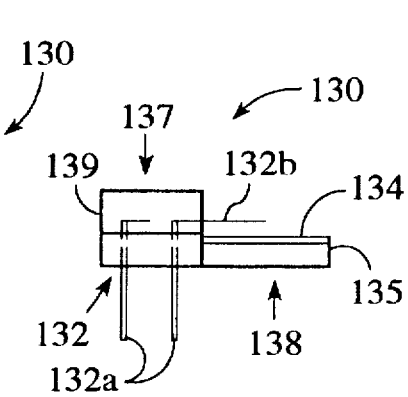
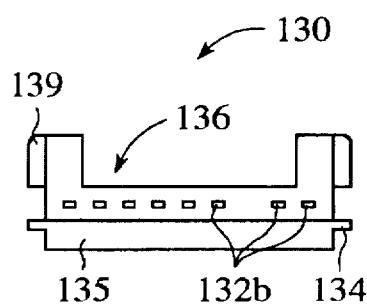
FIG. 10  FIG. 11  FIG. 12
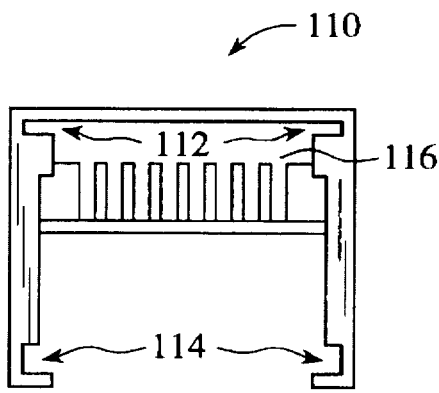
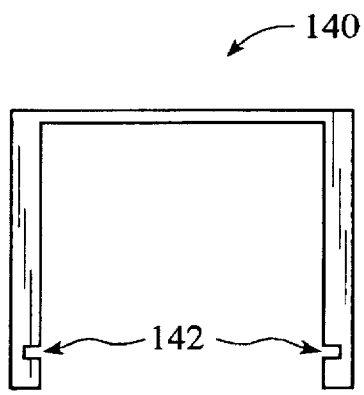
FIG. 13  FIG. 14

MODULAR JACK HAVING BUILT-IN CIRCUITRY

TECHNICAL FIELD OF THE INVENTION

The present invention relates generally to modular jack assemblies, and more specifically to a modular jack having a built-in signal wave shaping, isolation transformers and common mode choke circuitry.

BACKGROUND ART

High speed communications boards typically incorporate various kinds of connectors by which telecommunications equipment are connected. One kind of connector is an RJ-45 connector, which resembles the RJ-11 modular jacks commonly found with modern telephone equipment in a home. Typical high speed applications include networks such as Ethernet and Token Ring operating over a 10BASE-T or 100BASE-T lines, and digital switching systems such ISDN and ATM.

A problem common to modular jacks used in digital communications is their tendency to emit high frequency radiation. Because of the close proximity of the pins in the modular jacks, there tends to be cross-coupling of the radiation between adjacent pins. In addition, digital transmissions generally are sensitive to noise artifacts. For these reasons, high speed communications boards usually include various filtering components in order to minimize unwanted cross-talk and provide the required isolation between the user and the line and filtering of undesirable noise to allow only the necessary frequency bandwidth to pass for accurate communication.

Noise suppressors, such as a common mode choke coil, are known in the art. The noise suppression circuitry is mounted on the PC motherboard and is connected in series with a modular jack, which is also mounted to the PC board. However, such signal conditioning devices consume board real estate, which could otherwise be used to mount additional circuitry. In addition, the signal traces required to route the signals from the modular jack to the signal conditioning devices degrade the signal somewhat, thereby lowering the signal-to-noise ratio.

A solution is to provide the same circuitry within the modular jack assembly. Such an approach is described in U.S. Pat. No. 5,069,641 to Sakamoto et al., wherein a modular jack incorporates standard noise suppression circuitry. Sakamoto et al. identify a common mode choke coil and a three-terminal capacitor arrangement as typical examples of noise suppressors. Since the noise induced in the contact pins of the modular jack have similar spectral content, adequate cancellation of noise can be achieved by differential circuits such as those listed above. However, high speed applications such as LANs and ATM switches require additional more sophisticated signal conditioning circuitry. Since the spectral content of the noise in each of the transmit and receive lines is different, a simple differential operation would not suffice to eliminate such noise. High speed communications boards which incorporate prior art modular jacks, therefore, still require conventional on-board signal conditioning elements to provide sufficient conditioning of digital transmissions.

What is needed is a filtered modular jack which provides the signal conditioning needed by high speed transmission systems and which occupies approximately the same amount of board space on a printed circuit motherboard as do current modular jacks. In addition, due to the small dimensions of the components of a modular jack, there is a need to provide components that are designed to facilitate the manufacture of such modular jacks.

SUMMARY OF THE INVENTION

The modular jack of the present invention includes a set of contact pins and a set of mounting pins spaced apart from the contact pins. Portions of each set of pins extend beyond the rear of a housing member of the modular jack. Each set of pins is coupled to corresponding pin connection locations on a printed circuit board. The printed circuit board includes signal conditioning circuitry which serves to condition the signals and to provide electrical continuity between the contact pins and the mounting pins.

The contact pins engage corresponding contacts of a modular connector which plugs into the modular jack of the present invention. The mounting pins are inserted into a printed circuit motherboard, wherein traces in the motherboard provide a signal path from the mounting pins to other circuitry on the motherboard. The circuitry of the printed circuit board is thereby connected in series between the contact pins and the mounting pins.

In a preferred embodiment, the signal conditioning circuitry includes low pass filters, isolation transformers and common mode choke coils. More specifically, high order Butterworth filters are used for each of the transmit and receive pins. A seven pole Butterworth filter is contemplated for the transmit filter and a five pole Butterworth filter is contemplated for the receive filter.

Manufacture of the modular jack is simplified by the design of a sub-assembly which carries the mounting pins. An integrally formed platform extends the mounting pin sub-assembly to provide a surface which facilitates alignment of the printed circuit board to the extending portions of the contact and mounting pins.

The present invention is fully described by the drawings listed below, as explained in the discussion which follows.

BRIEF DESCRIPTION OF THE DRAWINGS

FIGS. 7-9 show the top, side and rear views of the contact pin array.

FIGS. 10-12 show the top, side and rear views of the mounting pin array.

FIG. 13 shows a frontward looking view of the main housing from the rear of the main housing.

FIG. 14 shows a rear view of the rear housing portion.

BEST MODE FOR CARRYING OUT THE INVENTION

Figure 1:
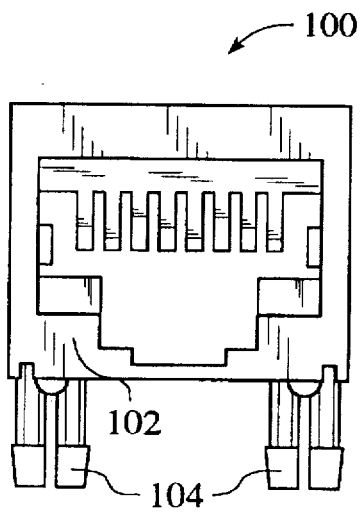
FIGS. 1 and 2 show front and side views of a modular jack in accordance with the present invention.
Figure 2:
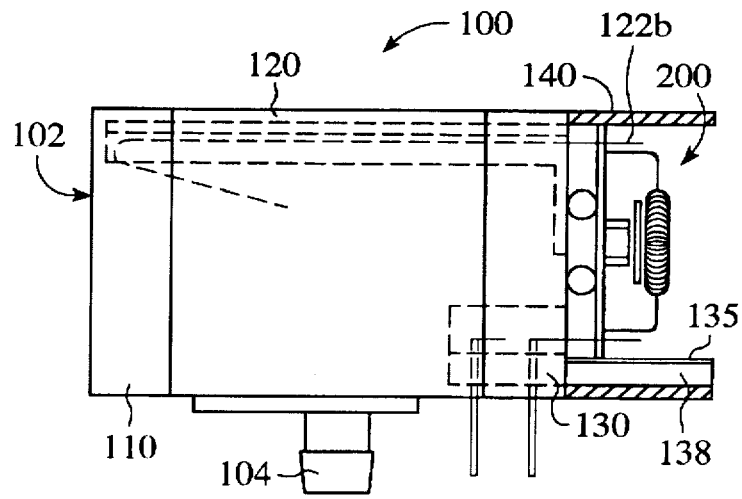
Figure 3:
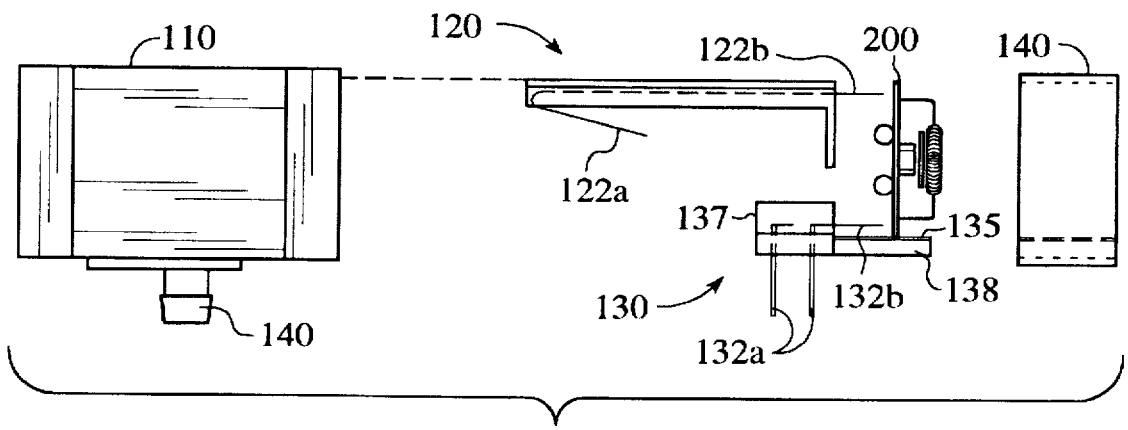
FIG. 3 is an exploded view of the modular jack shown in FIG. 1.

The modular jack assembly of the present invention is shown in assembled form in FIGS. 1 and 2. The face 102 of the modular jack 100 shows an opening into a chamber for receiving a modular connector (not shown). Mounting posts 104 allow the modular jack to be mounted to a motherboard (not shown). A description of the individual components of the modular jack will be provided prior to discussing the assembly of the modular jack as shown in FIG. 3.

Turning then to FIGS. 7–9, the top, side and rear views of a contact pin array 120, respectively, are shown. The contact pin array 120 is formed of molded plastic or other insulative material and has the shape of an L. As can be seen from the side and rear views of FIGS. 8 and 9, a flange 124 is formed along a leg of the L-shape. The contact pin array 120 includes a set of contact pins 122 molded within the plastic L-shaped form. Each of the contact pins has a first portion 122a and a second portion 122b. The first portions of the contact pins 122a are bent back toward the "interior" region of the L-shape, as seen from the side view of FIG. 8. The second portions of the contact pins 122b extend outwardly from the bend in the L-shape of the array 120.

FIGS. 10–12 show respectively the top, side and rear views of a mounting pin array 130. Like, the contact pin array 120, the mounting pin array 130 is formed of a plastic or otherwise non-conductive material. The non-conductive body of the array 130 includes a forward portion 137 which consists of a recessed region 136 and a rail 139 formed on each side of the forward portion. A rearward portion 138 consists of a platform 135 and a flange 134 formed along the sides of the platform. Embedded within the non-conductive body of the array 130 is a set of mounting pins 132. As can be seen from the side view of FIG. 11, each of the mounting pins 132 is bent to form two portions. A mounting portion 132a of each pin extends downwardly from the array 130, and a rearward portion 132b extends rearwardly, extending over the platform 135.

FIG. 13 shows a main housing unit 110 which encloses most of the components of the modular jack of the present invention. The view in FIG. 13 is taken from the rear of the housing, looking toward the front of the housing. Two sets of guide recesses are formed into the interior surface of the housing 110. A pair of flange guides 112 is recessed into the upper region of the interior of the housing 110, and a pair of notched guides 114 is formed into the lower region of the interior. Also formed in the interior region of the main housing 110 is a contact pin comb structure 116.

Turning now to FIG. 14, a rear housing portion 140 is shown. It is a three sided structure having a pair of flange guides 142 formed along a lower portion of the interior wall of the housing.

Figure 4:
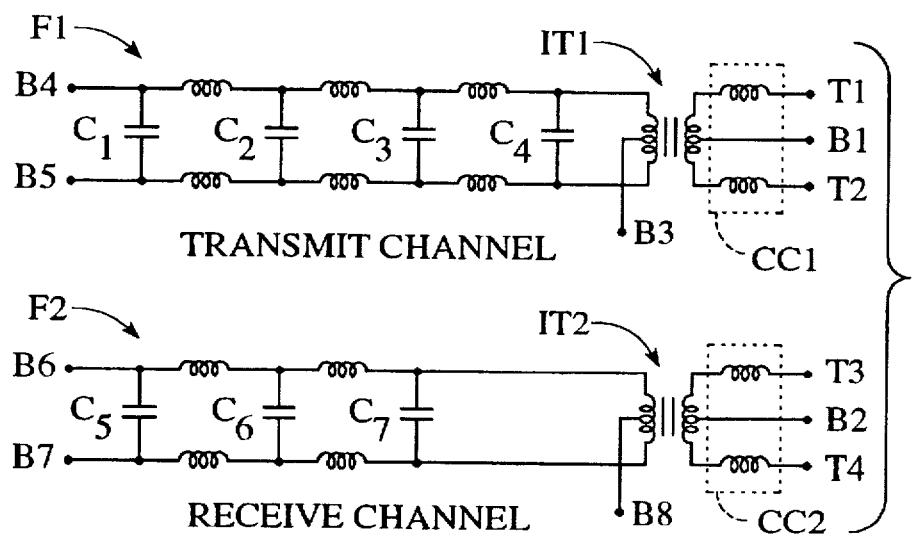
FIG. 4 is a schematic diagram of typical circuitry used in the present invention.

The electronic circuitry integrated with the modular jack of the present invention is shown in the schematic diagram of FIG. 4. The circuitry is composed of the following two channels: A transmit channel consists of a common mode choke coil CC1 specifically designed to provide common mode noise rejection for the particular application, (e.g. 10BASE-T, 100BASE-T, token ring and ATM), an isolation transformer IT1 to provide the required isolation between the user and the line (e.g. 2,000 Vrms isolation between user and line), and a filter F1 consisting of various inductive and capacitor elements to provide signal wave shaping and filtering, thus providing the necessary bandpass characteristic for the particular application to ensure data integrity and accurate data transmission. Likewise, a receive channel consists of a common mode choke coil CC2 specifically designed to provide common mode noise rejection for the particular application, an isolation transformer IT2 for isolation between the user and the line, and a filter F2 consisting of various inductive and capacitor elements for the signal wave shaping and filtering required by the particular application.

While prior art modular jacks which incorporate differential noise suppression circuitry effectively eliminate minimal, non-application specific common mode noise, such circuitry is inadequate for eliminating the harmonic noise that is present in the transmit and receive pins of the modular jacks. Since harmonic noise arises from the signal itself, the noise in each of the transmit and receive pins has a frequency spectrum that varies with the data being transmitted or received. Since the transmitted data stream is different from the received data stream, the harmonic noise generated by the transmitted data will have a different frequency spectrum from the harmonic noise generated by the received data. Thus, simple differential cancellation is ineffective in eliminating such noise and individual filtering of the transmit and receive pins is required. The circuits shown in FIG. 4 are typical signal conditioning circuits for a 10BASE-T application. More specifically, the transmit channel shown includes a seven pole balanced low pass Butterworth filter, while the receive channel shown in FIG. 4 includes a five pole balanced low pass Butterworth filter. The circuits also include a common mode choke coil for common mode noise rejection and an isolation transformer to provide the required 2,000 Vrms isolation between the user and the line as called for by various safety agencies, including IEEE and ANSI. Other filters for 10BASE-T applications are known. More generally, filters for high speed communications applications such as 100BASE-T and Token Ring applications are known. Such filters can be used in place of the filters shown in FIG. 4 without departing from the spirit and scope of the present invention.

Figure 5:
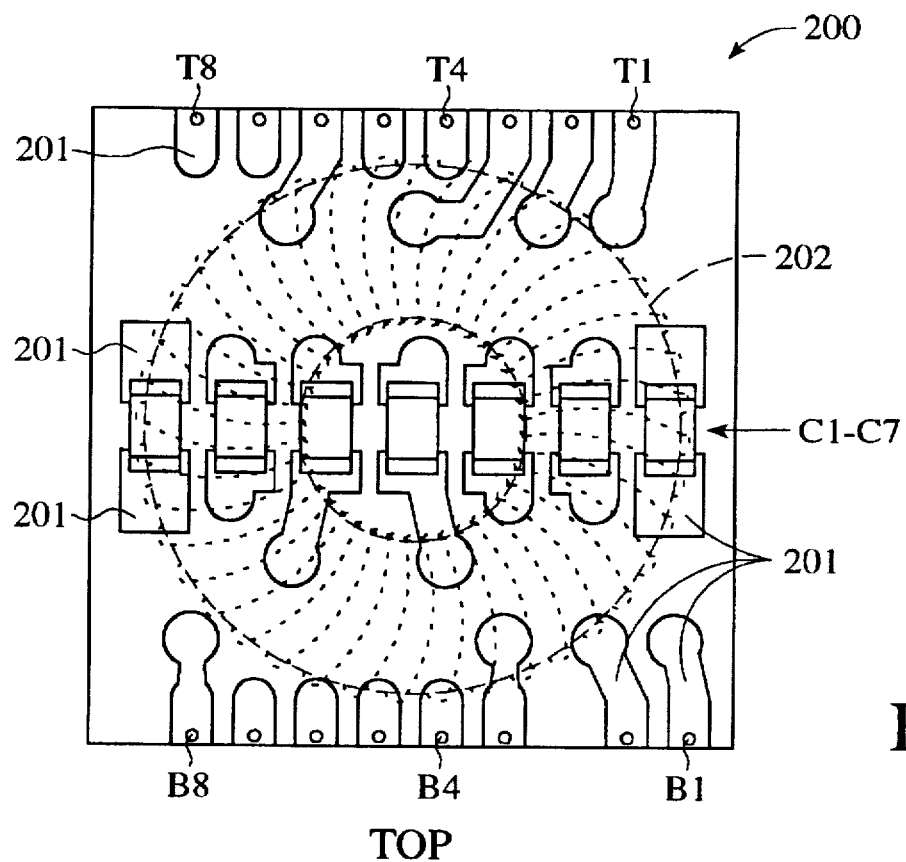
FIGS. 5 and 6 show the top and bottom layouts of the printed circuit board.
Figure 6:
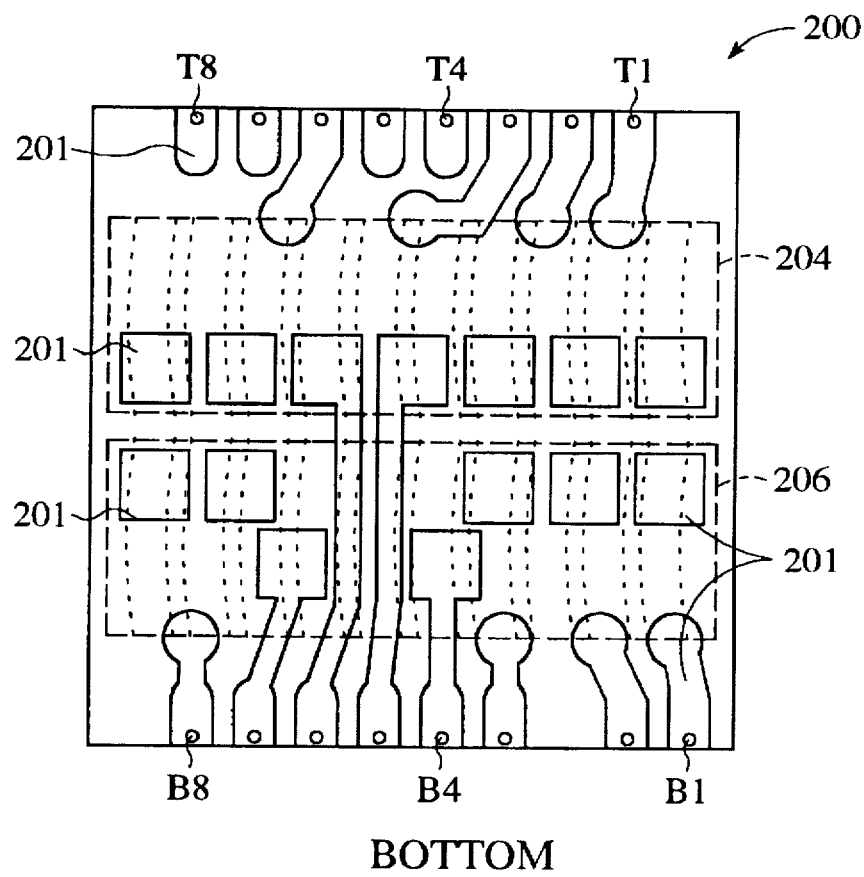

FIGS. 5 and 6 show a printed circuit board 200 and the components which implement the transmit and receive filters shown in FIG. 4. Shown is a view of the top side (FIG. 5) of the printed circuit board and a view of the bottom side (FIG. 6) of the board as seen from the top side of the board. The terminals T1–T4 and B1–B8, shown in FIG. 4, correspond to the connection locations T1–T4 and B1–B8 on the printed circuit board 200, which in the present embodiment of the invention are through holes (vias) formed through the board. The top side of the board 200 carries the capacitors C1–C7 of the two filter circuits in FIG. 4. The top side of the board also includes four toroidal transformers 202 (shown in phantom), two of which serve as the isolation coils IT1, IT2, and two of which serve as the common mode choke toroids CC1, CC2 for filtering of common mode noise as shown in FIG. 4. Mounted to the bottom side of the board 200 are two comb bobbins 204, 206 (shown in phantom). The first comb bobbin 204 contains six separate coils wound around a ferrite core to provide the six inductors used for the transmit filter (FIG. 4). Likewise, the second comb bobbin 206 contains four separate windings around a ferrite core to provide the four inductors of the receive filter. Finally, appropriate connections are made between these components and traces 201 formed on the top and bottom sides of the printed circuit board in accordance with the schematic diagram of FIG. 4 to implement the transmit and receive channels.

Having described the individual components of the modular jack, the discussion turns now to the exploded view of FIG. 3 which illustrates the assembly of the components of the modular jack 100 of the present invention. As can be seen, the contact pin sub-assembly 120 is inserted into the main housing 110. The sub-assembly 120 is guided into the main housing 110 by fitting the flanges 124 formed along the sides of the sub-assembly into the flange guides 112 formed in the housing. As described above, the contact pins 122 of the sub-assembly 120 have first portions 122a which project into the cavity of the housing 110. The sub-assembly is positioned so that the second portions 122b of the contact pins project in a rearward direction extending beyond the rear of the housing. See also FIG. 2.

Next is the mounting pin sub-assembly 130 which also fits into the housing 110 in a manner similar to the contact pin sub-assembly 120. The forward portion 137 of the mounting pin sub-assembly 130 is guided into the housing by fitting the rails 134 of the sub-assembly 130 into the notched guides 114 of the housing as shown in FIG. 2. The rearward portion 138 of the sub-assembly 130 extends beyond the rear of the housing 110. The mounting portions 132a of the pins 132 extend downwardly from the housing and are generally parallel with the mounting posts 104 of the housing. The mounting portions of the pins insert into corresponding through holes formed through a motherboard (not shown), and together with the mounting posts 104 serve to securely anchor the modular jack onto the motherboard. When the mounting sub-assembly 130 is properly assembled, the platform member 135 protrudes beyond the rear of the main housing 110. Likewise, the rearward portions 132b of the mounting pins 132 extend rearwardly beyond the rear of the housing.

The printed circuit board 200 is coupled between the portions of the contact pins 122b and the mounting pins 132b which extend rearwardly of the housing 110. The signal conditioning electronics residing on the board 200 provides electrical continuity between the contact pins and the mounting pins. In a preferred embodiment, the printed circuit board 200 is mounted in a vertical direction, as shown in FIGS. 3 and 2. This has the advantage of minimizing the footprint of the modular jack, thus reclaiming some of the real estate on the motherboard to allow for additional circuitry, while at the same providing the necessary signal conditioning circuitry for the particular needs of high speed data transmissions.

The vertical mounting of the board 200 is facilitated by the presence of the platform 135 of the mounting pin sub-assembly 130 which extends beyond the housing 110 and beneath the rearward portions 132b of the mounting pins. During manufacture, the platform 135 aids in aligning the circuit board 200 with the contact pins 122b and the mounting pins 132b. The through holes (vias) T1–T8 and B1–B8 formed in the circuit board 200 are aligned so that when the circuit board rests upon the surface of the platform 135, the pins 122b and 132b are substantially aligned with the through holes. More specifically, the vertical distance between the contact pins 122b and the top surface of the platform 135 is substantially equal to the distance between the through holes T1–T8 of the printed circuit board 200 and the bottom edge of the board. Similarly, the vertical distance between the mounting pins 132b and the top surface of the platform 135 is substantially equal to the distance between the through holes B1–B8 of the board 200 and the bottom edge of the board. Thus, when the circuit board is placed upon the platform, the through holes (vias) are aligned with the pins 122b, 132b.

The mounting of the printed circuit board 200 is further facilitated by having the contact and mounting pins project rearwardly in a direction away from the main housing 110. This allows the contact pin array 120 and the mounting pin array 130 first to be securely attached to the housing. The printed circuit board can then be easily inserted into position in a subsequent step during manufacture.

As shown in FIG. 2, when the printed circuit 200 is properly attached to the contact and mounting pins, the board extends, beyond the rear of the main housing 110 leaving the circuitry exposed. The rear housing portion 140 provides a cover, encasing the printed circuit board. The flanged guides 142 of the rear housing portion engage the flanges 134 formed along the sides of the platform 135 of the mounting pin sub-assembly 130. Finally, a potting compound is used to fill-in the unoccupied space enclosed by the rear housing portion 140, providing a protective encasement for the circuitry.

We claim:

1. A modular jack comprising:

a housing having a forward aperture opening into a receiving cavity, said housing further having a rear opening;

a plurality of contact pins, each contact pin having a portion projecting into said receiving cavity and a rearward portion projecting away from said rear opening;

a plurality of mounting pins disposed within said housing and in spaced relation with respect to said contact pins, each mounting pin having a rearward portion projecting away from said rear opening; and a printed circuit board having a first and a second plurality of pin connection locations and further having electronic circuitry including a transmit circuit and a receive circuit, each said transmit and receive circuit including a signal wave shaping circuit, an isolation transformer and a common mode choke coil;

said signal wave shaping circuit of said transmit circuit being a seven pole Butterworth low pass filter and said signal wave shaping circuit of said receive circuit being a five pole Butterworth low pass filter;

said rearward portions of said contact pins electrically coupled at said first pin connection locations;

said rearward portions of said mounting pins electrically coupled at said second pin connection locations;

whereby said electronic circuitry of said printed circuit board provides electrical continuity between said contact pins and said mounting pins.

2. The modular jack of claim 1, wherein said printed circuit board is disposed vertically, being perpendicular with respect to a major surface of a motherboard when said modular jack is mounted to said motherboard.

3. The modular jack of claim 2, wherein said printed circuit board is encapsulated in a potting compound.

4. The modular jack of claim 1, further including a mounting pin sub-assembly containing said mounting pins; said sub-assembly further having a platform extending beneath said rearward portions of said mounting pins; said printed circuit board having a bottom edge; said rearward portions of said contact pins being spaced apart from said platform by a distance approximately equal to a distance of separation between said first pin connection locations and said bottom edge; and said rearward portions of said mounting pins being spaced apart by a distance approximately equal to a distance of separation between said second pin connection locations and said bottom edge.

5. A modular jack comprising:

a main housing member having a chamber and a rearward opening leading into said chamber;

a contact array including a row of contact pins formed therein, each contact pin having a first portion and a rearwardly extending portion;

a mounting array including a row of mounting pins formed therein, each mounting pin having a downwardly extending portion and a rearwardly extending portion, said mounting array further including a rearwardly extending platform projecting in the same direction as said rearwardly extending portions of said contact pins and said mounting pins;

a printed circuit board having a transmit circuit and a receive circuit, said printed circuit board further having a first and a second row of vias formed therethrough, said first and said second row of vias each being separated from a bottom edge of said board by a first and a second distance, respectively; and a rear housing member;

said row of contact pins having a spacing from said platform substantially equal to said first distance;

said row of mounting pins having a spacing from said platform substantially equal to said second distance;

said printed circuit board being coupled to said rows of contact pins and mounting pins at said first and second rows of vias, respectively;

said rear housing member engaging said platform, thereby enclosing said printed circuit board.

6. The modular jack of claim 5 wherein said transmit circuit includes a first isolation transformer, a first common mode choke coil and a seven pole Butterworth low pass filter and said receive circuit includes a second isolation transformer, a second common mode choke coil and a five pole Butterworth low pass filter.

7. The modular jack of claim 5 further including a potting compound for encapsulating said printed circuit board.

8. A modular jack comprising:

a housing having a forward aperture opening into a receiving cavity, said housing further having a rear opening;

a plurality of contact pins, each contact pin having a portion projecting into said receiving cavity and a rearward portion projecting away from said rear opening;

a plurality of mounting pins disposed within said housing and in spaced relation with respect to said contact pins, each mounting pin having a rearward portion projecting away from said rear opening; and a printed circuit board having a first and a second plurality of pin connection locations and further having electronic circuitry including a transmit circuit and a receive circuit, each said transmit and receive circuit including a signal wave shaping circuit, an isolation transformer and a common mode choke coil;

a mounting pin sub-assembly containing said mounting pins; said sub-assembly further having a platform extending beneath said rearward portions of said mounting pins; said printed circuit board having a bottom edge; said rearward portions of said contact pins being spaced apart from said platform by a distance approximately equal to a distance of separation between said first pin connection locations and said bottom edge; and said rearward portions of said mounting pins being spaced apart by a distance approximately equal to a distance of separation between said second pin connection locations and said bottom edge;

said rearward portions of said contact pins electrically coupled at said first pin connection locations;

said rearward portions of said mounting pins electrically coupled at said second pin connection locations;

whereby said electronic circuitry of said printed circuit board provides electrical continuity between said contact pins and said mounting pins.

9. The modular jack of claim 8, wherein said signal wave shaping circuit of said transmit circuit is a seven pole Butterworth low pass filter and said signal wave shaping circuit of said receive circuit is a five pole Butterworth low pass filter.

10. The modular jack of claim 8, wherein said printed circuit board is disposed vertically, being perpendicular with respect to a major surface of a motherboard when said modular jack is mounted to said motherboard.

11. The modular jack of claim 10, wherein said printed circuit board is encapsulated in a potting compound.

* * * * *